US012803500B2

(12) United States Patent
Wan et al.

(10) Patent No.: US 12,803,500 B2
(45) Date of Patent: Nov. 17, 2026

(54) QUARTZ CRYSTAL OSCILLATOR AND AN ELECTRONIC DEVICE THEREOF

(71) Applicants: TKD Science and Technology Co., LTD., Suizhou (CN); HUAZHONG UNIVERSITY OF SCIENCETECHNOLOGY, Wuhan (CN)

(72) Inventors: Yang Wan, Suizhou (CN); Fengshun Wu, Suizhou (CN); Xiaowei Zhang, Suizhou (CN); Mingfan Liu, Suizhou (CN); Feng Xiong, Suizhou (CN); Chaoyang Peng, Suizhou (CN)

( * ) Notice: Subject to any disclaimer, the term of this patent is extended or adjusted under 35 U.S.C. 154(b) by 0 days.

(21) Appl. No.: 19/061,934

(22) Filed: Feb. 24, 2025

(65) Prior Publication Data

US 2026/0196966 A1 Jul. 9, 2026

(30) Foreign Application Priority Data

Jan. 3, 2025 (CN) ........................ 202510009405.X

(51) Int. Cl.
*H03B 5/32* (2006.01)
*H10N 30/87* (2023.01)

(52) U.S. Cl.
CPC ............... *H03B 5/32* (2013.01); *H10N 30/87* (2023.02)

(58) Field of Classification Search
CPC ................................. H03B 5/32; H10N 30/87
USPC .......................................................... 331/158
See application file for complete search history.

(56) References Cited

U.S. PATENT DOCUMENTS 6,229,249 B1 * 5/2001 Hatanaka ............. H05K 3/3442
310/348
2013/0335157 A1 * 12/2013 Ishii ..................... H03H 9/1021
310/365

FOREIGN PATENT DOCUMENTS

JP 2004096163 * 3/2004

* cited by examiner

*Primary Examiner* — Richard Tan
(74) *Attorney, Agent, or Firm* — Sam Pierce

(57) ABSTRACT

The present application relates to the technical field of resonators, specifically to a quartz crystal oscillator and electronic device, wherein the quartz crystal oscillator includes an encapsulation structure that has a pair of first electrodes inside; a spacer quartz wafer that is located inside the encapsulation cavity and is electrically bonded to the encapsulation structure at a pair of first electrodes; a quartz chip including a quartz wafer body and a pair of excitation electrodes arranged on opposite sides of the quartz wafer body; the lead-out ends of a pair of excitation electrodes are spaced apart on the opposite side of the quartz wafer body and the spacer quartz wafer, the spacer quartz wafer and quartz wafer body are electrically bonded at the lead-out ends of the pair of excitation electrodes, respectively, so that a pair of excitation electrodes are connected to a pair of first electrodes, respectively.

7 Claims, 6 Drawing Sheets

QUARTZ CRYSTAL OSCILLATOR AND AN ELECTRONIC DEVICE THEREOF

CROSS-REFERENCE TO RELATED APPLICATIONS

The present application is based upon and claims priority to Chinese patent application No. 202510009405.X, filed on Jan. 3, 2025, the entire content of which is incorporated herein by reference.

TECHNICAL FIELD

The present application relates to the technical field of quartz resonators, particularly to a quartz crystal oscillator and an electronic device thereof.

BACKGROUND

In the design of a precision electronic system, quartz crystal oscillators serve as time reference sources, including temperature compensated crystal oscillators (TCXOs) and thermal sensitive crystal resonators. TCXOs and thermal sensitive crystal resonators play important roles in optimizing frequency stability in special temperature environments. TCXO is a quartz crystal oscillator that reduces the oscillation frequency changes caused by ambient temperature changes through an additional temperature compensation circuit. Compared to TCXOs, the thermal sensitive crystal resonators have a simpler production process, with lower costs and shorter production cycles, making them popular in large-scale production and cost sensitive electronic products, such as consumer electronics and basic communication equipment. Thermistor crystal resonator is an economical improvement scheme based on traditional surface mount crystal oscillator, which cleverly integrates temperature sensing and frequency adjustment functions by integrating thermistor and varactor diode. Thermistors are responsible for monitoring changes in environmental temperature, while varactor diodes adjust own capacitance based on temperature sensing signals, indirectly adjusting the oscillation frequency of the crystal oscillator. This design enables the thermal sensitive crystal resonator to automatically adjust within a certain temperature range, maintaining a relatively stable frequency output.

Related document 1 discloses a crystal resonator comprising a substrate portion, a first frame portion, and a second frame portion, a crystal oscillation element in the first frame portion, a thermistor in the second frame portion, and a cover sealing the first frame portion; wherein the external connection terminals 9*a* to 9*d* are formed at the four corners of the surface of the second frame portion, and non-connection terminals 10*a* to 10*d* that are not electrically connected to the crystal oscillation element or thermistor are formed at positions adjacent to the external connection terminals 9*a* to 9*d* in the second frame portion. By means of the above configurations, the piezoelectric vibration device can be miniaturized and can suppress solder cracking after installation on an external substrate.

However, with the continuous development of microelectronic products, quartz crystal oscillators are facing higher requirements. In response to the relevant technologies mentioned above, it is required to further improve the output frequency stability of quartz crystal oscillators.

SUMMARY

The purpose of the present application is to provide a quartz crystal oscillator and an electronic device thereof in order to reduce the influence of thermal stress on the vibration zone of the excitation quartz wafer and improve the output frequency stability of quartz crystal oscillator.

In the first aspect, the quartz crystal oscillator provided by the present application uses the following technical solution:

a quartz crystal oscillator comprising an encapsulation structure that has a pair of first electrodes inside;

a spacer quartz wafer that is located inside the encapsulation cavity and is electrically bonded to the encapsulation structure at a pair of first electrodes;

a quartz chip comprising a quartz wafer body and a pair of excitation electrodes arranged on opposite sides of the quartz wafer body; the lead-out ends of a pair of excitation electrodes are spaced apart on the opposite side of the quartz wafer body and the spacer quartz wafer, the spacer quartz wafer and quartz wafer body are electrically bonded at the lead-out ends of the pair of excitation electrodes, respectively, so that a pair of excitation electrodes are connected to a pair of first electrodes, respectively.

By using the above technical solution, a spacer quartz wafer is provided between the encapsulation structure and the quartz chip, and the spacer quartz wafer is bonded to the encapsulation structure and the excitation quartz chip separately, without affecting the formation of piezoelectric effect by the quartz wafer body through a pair of excitation electrodes and, in addition, the spacer quartz wafer and quartz wafer body made of the same material have the same thermal expansion coefficient and, on the basis of not affecting the installation of quartz wafer body, can effectively reduce the influence of thermal stress on the vibration zone of the excitation quartz chip and improve the output frequency stability of the quartz crystal oscillator.

Optionally, the distance between the spacer quartz wafer and the quartz wafer body is 30-50 μm.

By using the above technical solution, the distance between the spacer quartz wafer and the quartz wafer body is set to 30-50 μm, which meets the vibration space requirements of quartz wafer body without changing the encapsulation size of quartz crystal oscillator.

Optionally, the spacer quartz wafer has a pair of second electrodes spaced apart along a width direction of the quartz wafer body, and each second electrode comprises:

an upper connection portion located on one side of the spacer quartz wafer, and the upper connection portion is opposite to and electrically bonded to the lead-out end of one of the excitation electrodes;

a lower connection portion located on the other side of the spacer quartz wafer, which is opposite to one of the first electrodes and is conductive and bonded;

a transition portion that is connected to the upper connection portion and the lower connection portion, respectively.

By using the above technical solution, the second electrode can effectively provide electrical connection between the excitation electrode and the first electrode.

Optionally, along a length direction of the quartz wafer body, the ratio of the length of spacer quartz wafer to the length of quartz wafer body is less than 0.5.

By using the above technical solution, the spacer quartz wafer is limited to ensure the installation stability of spacer quartz wafer, while reducing the influence of thermal stress on the vibration zone of excitation quartz chip.

Optionally, along a length direction of the quartz wafer body, one electrically bonded end of the spacer quartz wafer protrudes from the projection of quartz wafer body along a thickness direction thereof.

By using the above technical solution, the spacer quartz wafer is offset relative to the quartz wafer body, further improving installation stability and enhancing the reduction effect on thermal stress.

Optionally, along the length direction of the quartz wafer body, the electrically bonded point of the spacer quartz wafer is located on the centerline thereof.

By using the above technical solution, the electrically bonded point is located in the centerline of spacer quartz wafer, further improving the installation stability of spacer quartz wafer.

Optionally, along a length direction of quartz wafer body, the ratio of the length of spacer quartz wafer to the length of quartz wafer body is 1.2-0.5:1, and the free end of spacer quartz wafer is supported in the encapsulation cavity.

By using the above technical solution, the spacer quartz wafer has a considerable length, and is supported at the free end such that the installation stability of spacer quartz wafer is ensured while the output frequency stability of quartz crystal oscillator is improved.

Optionally, at one electrically bonded end between the spacer quartz wafer and the quartz wafer body, the projections of the spacer quartz wafer and the quartz wafer body along the thickness direction of each other overlap.

By using the above technical solution, the reduction effect on the influence of thermal stress is improved.

Optionally, the rotation angle of the spacer quartz wafer, along its length direction, around the X-axis of corresponding crystal axis is 60° or 120°.

By using the above technical solution, the rotation angle of the spacer quartz wafer relative to the X-axis of corresponding crystal axis is limited to 60° or 120°, further reducing the sensitivity of stress transmission and improving the output frequency stability of quartz crystal oscillator.

In the second aspect, the electronic device provided by the present application adopts the following technical solution:

Electronic devices, including the quartz crystal oscillator described.

By using the above technical solution, the electronic device has a built-in quartz crystal oscillator to play the role of quartz crystal oscillator.

In summary, the present application includes at least one beneficial technical benefit as follows:

1. A spacer quartz wafer is provided between the encapsulation structure and the excitation quartz chip, effectively reducing the impact of thermal stress on the vibration zone of excitation quartz chip without affecting the installation of quartz wafer body, and improving the output frequency stability of quartz crystal oscillator.

2. The distance between the spacer quartz wafer and the quartz wafer body is set to 30-50 μm to provide vibration space for the quartz wafer body while not changing the size of the quartz crystal oscillator package. Furthermore, the size of the spacer quartz wafer and its relative position to the quartz wafer body can effectively improve the installation stability while also enhancing the improvement effect on the output frequency stability of quartz crystal oscillator;

3. The output frequency stability of quartz crystal oscillator is further improved by limiting the rotation angle of spacer quartz wafer.

Figure 1:
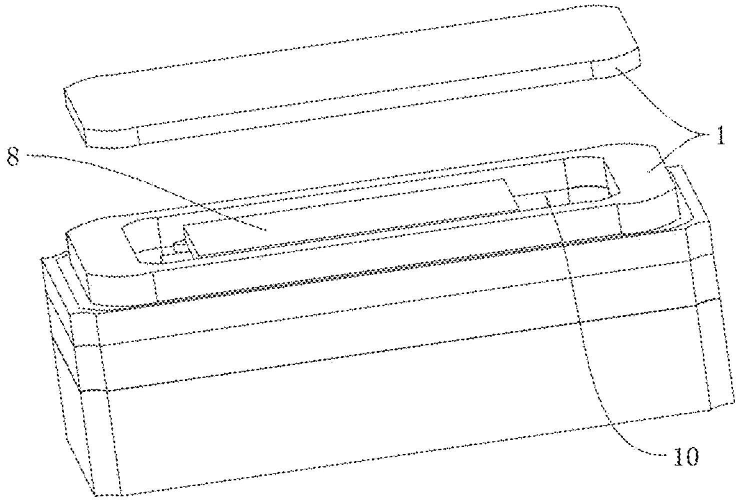
FIG. 1 is a schematic diagram of the overall structure of quartz crystal oscillator in Example 1 of the present application.

Reference Numerals in the figures: 1. Encapsulation structure; 10. Encapsulation cavity; 2. Base; 20. Electrode coating; 21. First solder pad; 22. Second solder pad; 23. Slot; 3. Substrate; 30. First electrode; 300. Upper conductive end; 301. Extension line; 302. Lower conductive end; 31. Electrode hole; 32. Third electrode; 4. Upper fence; 5. Connecting enclosure; 6. Upper cover; 7. spacer quartz wafer; 70. Second electrode; 700. Upper connecting portion; 701. Transition portion; 8. quartz wafer body; 9. Thermistor.

DETAILED DESCRIPTION OF THE EMBODIMENTS

Further detailed descriptions of the present application will be provided in conjunction with FIG. 1-11.

Example 1

Figure 2:
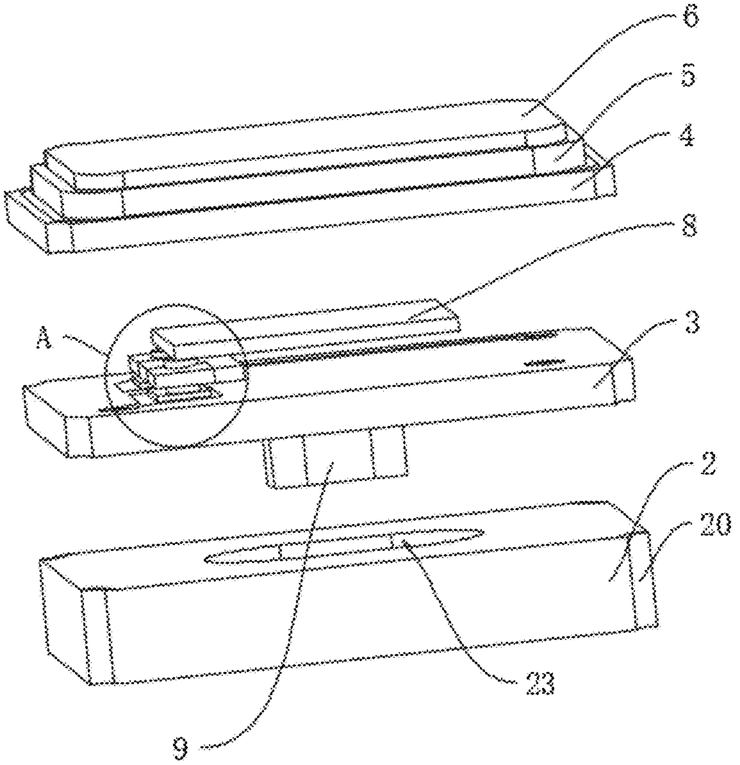
FIG. 2 is an exploded structure diagram of the quartz crystal oscillator in Example 1 of the present application.

Example 1 of the present application discloses a quartz crystal oscillator, as shown in FIGS. 1 and 2, comprising an encapsulation structure 1, a spacer quartz wafer 7, and an excitation quartz chip.

Quartz crystal oscillator can be a temperature compensated crystal oscillator (TCXO) or a thermal sensitive crystal resonator, wherein the TCXO adjusts the oscillation frequency through a built-in temperature compensation circuit to offset the impact of temperature changes on the crystal oscillator. Thermistor crystal resonator, based on traditional surface mount crystal oscillator, integrates thermistor and varactor diode. Thermistor is responsible for monitoring environmental temperature changes, while varactor diode adjusts its capacitance value based on temperature sensing signals, indirectly adjusting the oscillation frequency of the crystal oscillator. In this example, a thermal sensitive crystal resonator is taken as an example for specific explanation.

The encapsulation structure 1 has an encapsulation cavity 10 in which an excitation quartz chip is encapsulated. In an example, the encapsulation structure 1 comprises a base 2, a substrate 3, an upper enclosure 4, a connecting enclosure 5, and an upper cover 6 encapsulated on the connecting enclosure 5, which are sequentially fixed, to form an encapsulation cavity 10 through the cooperation among the substrate 3, the upper enclosure 4, the connecting enclosure 5, and the upper cover 6. The base 2, substrate 3, and upper enclosure 4 can be structures made of insulating materials such as ceramics or fiberglass and, for example, the base 2, substrate 3, and upper fence 4 are made of ceramics; the connecting enclosure 5 and upper cover 6 are both made of biodegradable substrates.

Figure 5:
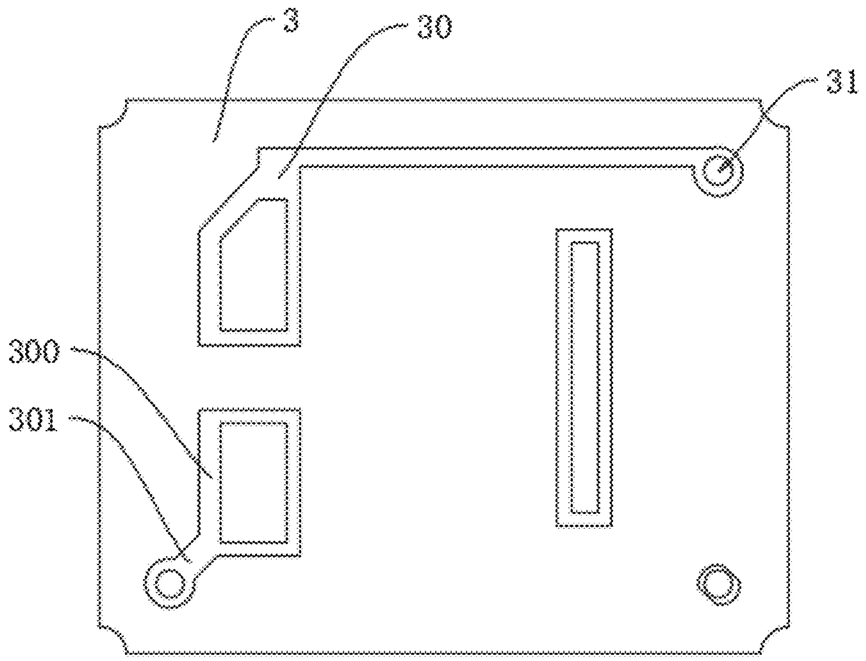
FIG. 5 is a top view of the substrate in Example 2 of the present application.
Figure 6:
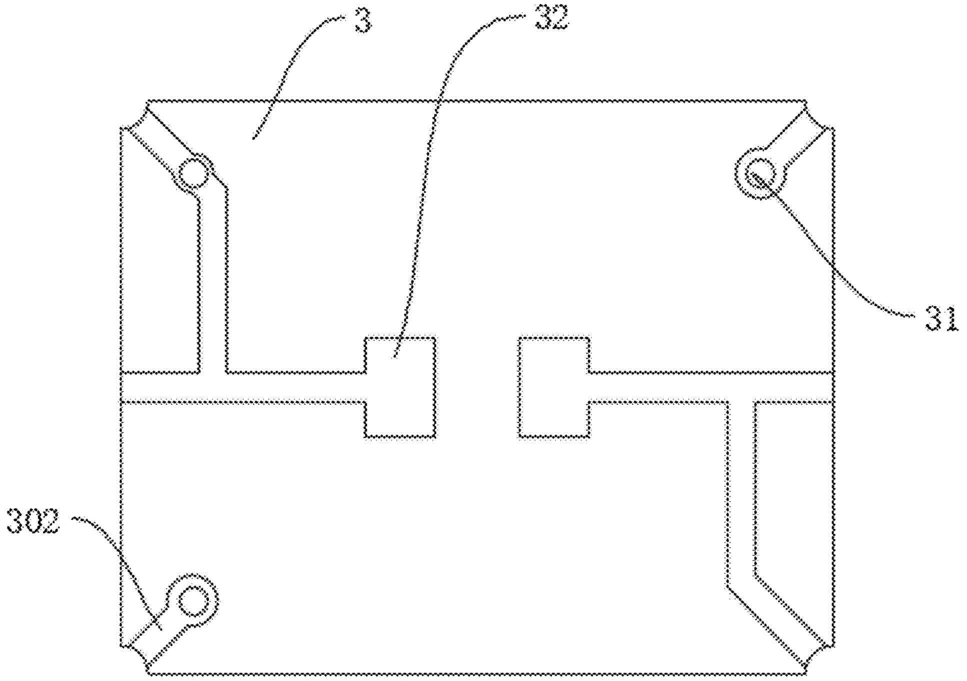
FIG. 6 is a bottom view of the substrate in Example 1 of the present application.

The encapsulation cavity 10 has a pair of first electrodes 30 inside and, as shown in FIG. 2, in an example, a pair of first electrodes 30 are provided on the substrate 3 and for example, as shown in FIGS. 5 and 6, each first electrode 30 includes an upper conductive end 300, an extension line 301, and a lower conductive end 302, the upper conductive end 300 of a pair of first electrodes 30 is located at one end of the substrate 3 along a length direction (left-right direction shown in FIG. 5), and is spaced apart along the width direction of encapsulation cavity 10 (up-down direction shown in FIG. 5); the substrate 3 has a pair of electrode holes 31 that run through, and the pair of electrode holes 31 are diagonally arranged, the extension line 301 of the pair of first electrodes 30 passes through the pair of electrode holes 31, and then a pair of lower conductive ends 302 are formed diagonally on the bottom surface of the substrate 3.

As shown in FIG. 2, an electrode coating 20 is provided on the side wall at the diagonal of the base 2 corresponding to a pair of lower conductive ends 302, a pair of electrode coatings 20 are led out to the bottom surface of the base 2 to form a pair of first solder pads 21 which are located at the diagonal of the base.

Figure 3:
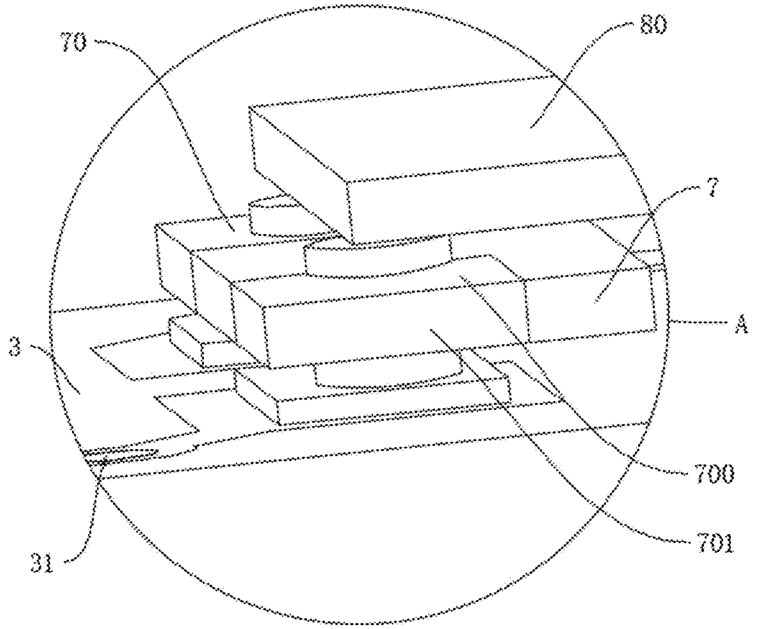
FIG. 3 is an enlarged view of part A in FIG. 2.

The spacer quartz wafer 7 is located inside the encapsulation cavity 10 and is electrically bonded to the encapsulation structure 1 at a pair of first electrodes 30. In this example, electrical bonding can be achieved specifically through conductive silver paste and, as shown in FIGS. 2 and 3, the spacer quartz wafer 7 is electrically bonded to the encapsulation structure 1, that is, with the substrate 3, and the electrical bonding point is at the upper conductive end 300 of the pair of first electrodes 30. In an example, the thickness difference between the spacer quartz wafer 7 and the quartz wafer body 8 does not exceed 10% of the thickness of quartz wafer body 8 and, in the example of present application, both have the same thickness.

An excitation quartz chip comprises a quartz wafer body 8 and a pair of excitation electrodes on opposite sides of the quartz wafer body 8, and the lead-out ends of the pair of excitation electrodes are spaced apart from each other on the opposite side of the quartz wafer body 8 and spacer quartz wafer 7. A pair of excitation electrodes are used to generate piezoelectric effect on the quartz wafer body 8, and the pair of excitation electrodes can be made of silver, gold, or gold silver alloy, depending on the actual situation. In this example, the lead-out ends of a pair of excitation electrodes are close to the upper conductive ends 300 of a pair of first electrodes 30, and correspond one-to-one with the pair of upper conductive terminals 300.

The spacer quartz wafer 7 and quartz wafer body 8 are electrically bonded at the lead-out ends of the pair of excitation electrodes, respectively, so that the pair of excitation electrodes are electrically connected to the pair of first electrodes 30, respectively, and a pair of excitation electrodes are led out to a pair of first pads 21.

In this example, the electrical connection between a pair of excitation electrodes and a pair of first electrodes 30 can be achieved through the connection between conductive adhesives. In order to improve the stability of the installation of spacer quartz wafer 7 and quartz wafer body 8, in an example, the spacer quartz wafer 7 has a pair of second electrodes 70, and the electrical connection between the pair of excitation electrodes and the pair of first electrodes 30 can also be achieved through a pair of second electrodes 70, for example, a pair of second electrodes 70 are spaced apart along a width direction of the quartz wafer body 8 and correspond one-to-one with the upper conductive ends 300 of a pair of first electrodes 30, and as shown in FIG. 3, each second electrode 70 comprises an upper connection portion 700, a transition portion 701 and a lower connection portion.

The upper connection portion 700 is located on one side of the spacer quartz wafer 7 (one side close to the quartz wafer body 8), and is opposite to and electrically bonded to one of the lead-out ends of the excitation electrodes; the lower connection portion is located on the other side of the spacer quartz wafer 7 (one side close to the substrate 3), and is opposite to and electrically bonded to one of the first electrodes 30 (specifically, the upper conductive end 300 of the first electrode 30).

The transition portion 701 is connected to the upper connection portion 700 and the lower connection portion, respectively.

In one example, to ensure miniaturization without affecting the vibration of quartz wafer body 8, the distance between the spacer quartz wafer 7 and the quartz wafer body 8 is 30-50 μm. In this example, the distance between the spacer quartz wafer 7 and the quartz wafer body 8 can be 30 μm, 40 μm, or 50 μm, and can also be 35 μm in this example of the present application, as long as the set distance can meet the requirements of size setting without affecting the vibration space of quartz wafer body 8.

In one example, to ensure support stability, along a length direction of the quartz wafer body 8, the ratio of the length of spacer quartz wafer 7 to the length of the quartz wafer body 8 is less than 0.5. In this example, the spacer quartz wafer 7 is disposed along the length direction of the quartz wafer body 8 to at least meet the requirements of electrical bonding. In further, in order to improve support stability, reduce the influence of thermal stress on the vibration zone of the excitation quartz wafer, and enhance the output frequency stability of the quartz crystal oscillator, the length of spacer quartz wafer 7 along the length direction of quartz wafer body 8 can be appropriately extended, and along a length direction of the quartz wafer body 8, one electrically bonded end of the spacer quartz wafer 7 protrudes from the projection of the quartz wafer body 8 along its thickness direction. In this example, the spacer quartz wafer 7 extends along the length direction of the quartz wafer body 8, and the adhesive points protruding from both ends have the equal length.

Figure 7:
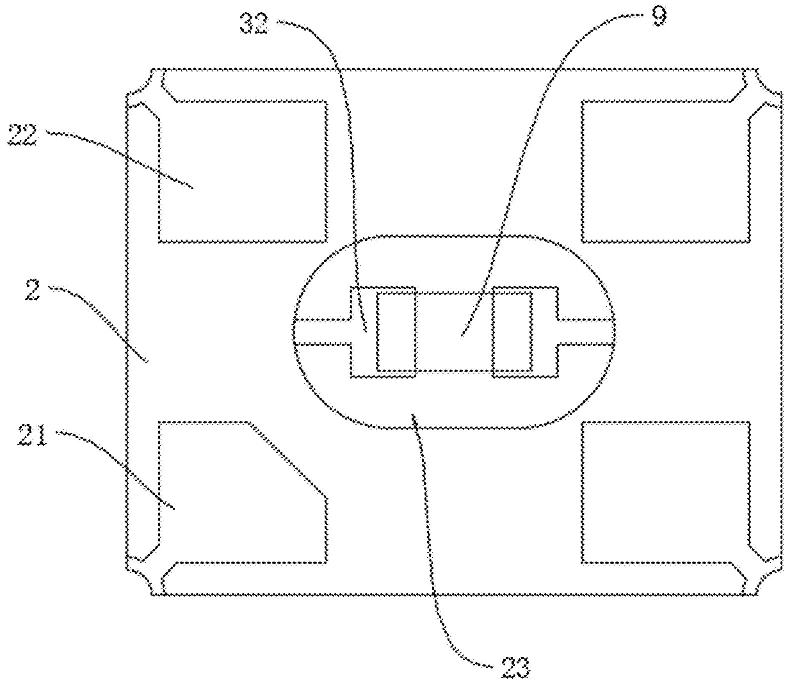
FIG. 7 is a bottom view of the quartz crystal oscillator in Example 1 of the present application.

In one example, for the installation of thermistor 9, a third electrode 32 is provided on the side of substrate 3 opposite to base 2, and thermistor 9 can be connected to the third electrode 32 through soldering at both ends. As shown in FIG. 7, for example, the third electrode 32 includes two second electrodes 70 that are opposite to each other extending to the other diagonal of the side of the substrate 3 opposite to the base 2; the side wall at the other diagonal of the base 2 also has an electrode coating 20, two second electrodes 70 extend through the pair of electrode coatings 20 and are respectively led out to the bottom surface of the base 2 to form a pair of second solder pads 22, and a pair of second solder pads 22 are located at the other diagonal of the bottom surface of the base 2.

The base 2 has a slot 23 that runs through the base, and the slot 23 is larger than the thermistor 9 and is used to accommodate the thermistor 9 as the structure of its encapsulating external wall and, in order to protect the thermistor 9 component against the compression and damage caused by external circuit boards, the depth of the slot 23 is greater than the height of thermistor 9 component, effectively raising the thermistor 9 through the base 2.

Example 1 of the present application is based on the following principles: the above-mentioned quartz crystal oscillator is a thermal sensitive crystal resonator and, when applied to electronic products, the quartz wafer body 8 subjected to an external alternating electric field generates mechanical vibration, and in further a specific frequency for use as a resonant element; the supplementary configuration of spacer quartz wafer 7 has the same thermal expansion coefficient as the quartz wafer body 8, and can effectively improve the influence of thermal stress on the vibration zone of quartz wafer body 8. For the thermal crystal resonator itself, in case of external temperature changes, corresponding changes occur to the equivalent series capacitance value formed by the resistance value of the thermistor 9 that fits with the thermal crystal resonator and other components (not shown in the drawing) in electronic products, offsetting or reducing the temperature drift of oscillation frequency of the quartz wafer body 8, thereby maintaining the accuracy of the oscillation frequency provided by the thermal crystal resonator to the outside.

Example 2

Figure 4:
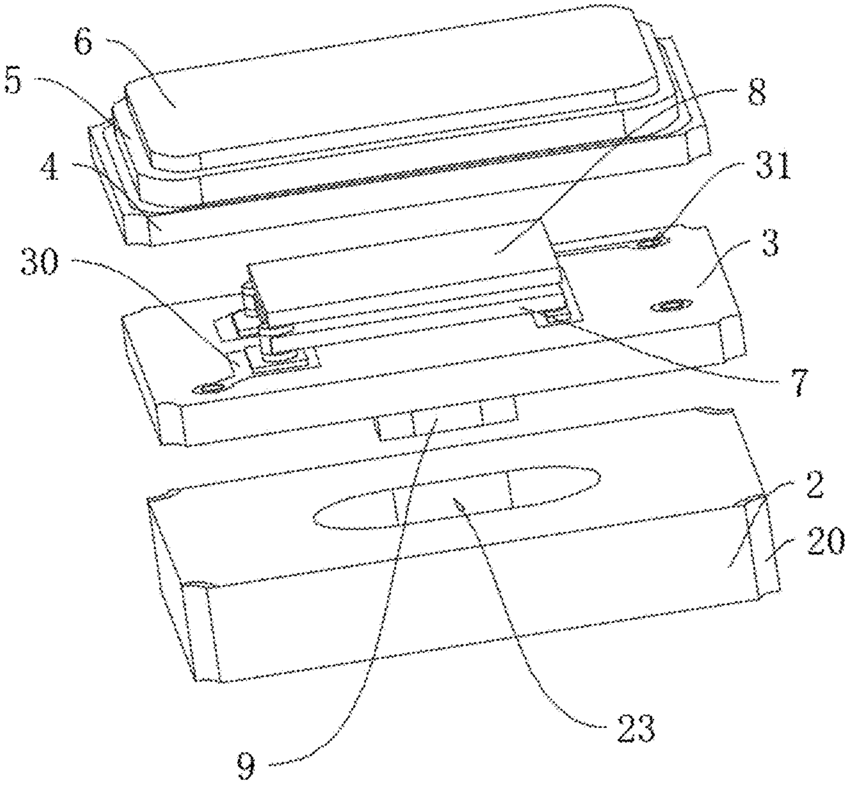
FIG. 4 is an exploded structure diagram of the quartz crystal oscillator in Example 2 of the present application.

Example 2 of the present application discloses a quartz crystal oscillator, and when a thermosensitive crystal resonator is taken as an example, as shown in FIG. 4, the difference between this example and Example 1 is that along the length direction of quartz wafer body 8, the length ratio of spacer quartz wafer 7 to the quartz wafer body 8 is 1.2-0.5:1. In one example, the ratio of the length of spacer quartz wafer 7 to the length of quartz wafer body 8 can be 1.2:1, 1:0.8, or 0.5:1, as long as the spacing can effectively improve the influence of thermal stress on the vibration zone of quartz wafer body 8 and enhance the output frequency stability of quartz crystal resonator. In the present embodiment, the ratio is set to 1:1, and the projections of the spacer quartz wafer 7 and the quartz wafer body 8 overlap in the thickness direction.

In order to improve the installation stability of spacer quartz wafer 7, the free end of spacer quartz wafer 7 is supported in the encapsulating cavity 10 and, for example, can be fixedly supported by adhesive the same as the electrical bonding between the other end of spacer quartz wafer 7 and the substrate 3, which improves the stability of the support.

Example 3

Example 3 of the present application discloses a quartz crystal oscillator and, a thermosensitive crystal resonator is taken as an example, and in order to further improve the output frequency stability of the quartz crystal oscillator, compared to Example 1, this example is further limited:

The rotation angle of the edge of spacer quartz wafer 7 along its length direction around axis X of corresponding crystal axis of the spacer quartz wafer is 60° or 120°. In one example, the rotation angle of the edge of spacer quartz wafer 7 along its length direction around axis X of corresponding crystal axis is 60°, or 120°, and 60° in this example of the present application.

Example 4

Example 4 of the present application discloses an electronic device including the quartz crystal oscillator.

The electronic device can be a built-in quartz crystal oscillator, mobile (or laptop) personal computer, portable phone (including PHS) with a built-in quartz crystal oscillator, or a digital still camera with a built-in quartz crystal oscillator.

Above electronic devices, such as personal computers, portable telephones, and digital still cameras, have quartz crystal oscillators, so that they can play the role of quartz crystal oscillator and provide excellent reliability.

In addition, besides personal computers, portable telephones, and digital still cameras, the quartz crystal oscillator of the present application can also be applied to smartphones, tablet terminals, clocks (including smartwatches), inkjet discharge devices, laptop personal computers, televisions, wearable terminals, cameras, video recorders, car navigation devices, pagers, electronic notebooks, electronic dictionaries, calculators, electronic gaming devices, word processors, workstations, video phones, anti-theft television monitors, electronic binoculars, POS terminals, medical equipment, fish detectors, measuring equipment, mobile terminal base station equipment, measuring instruments, flight simulators, network servers, etc.

In addition, electronic devices can also be mobile objects, including the quartz crystal oscillator mentioned above.

The mobile object can be a car with a built-in quartz crystal oscillator. Quartz crystal oscillators, for example, can be widely used in electronic control units (ECUs) such as keyless entry, anti-theft control systems, car navigation systems, car air conditioning, anti-lock braking systems (ABS), airbags, tire pressure monitoring systems (TPMS), engine control, battery monitors for hybrid or electric vehicles, and vehicle attitude control systems.

The quartz crystal oscillator and electronic device of the present application have been described above based on the illustrated examples. However, the present application is not limited to these examples, and the structure of each part can be replaced with any structure having the same function, and any other structures can also be added to the present application.

Comparative Example 1

Comparative Example 1 of the present application discloses a quartz crystal oscillator, and different from Example 1, this comparative example does not include a spacer quartz wafer 7.

Experimental Results

Thermistor crystal resonators were prepared according to Example 1 as shown in FIG. 2), Example 2 (as shown in FIG. 4, except that the spacer quartz wafer also has a second electrode as in Example 1), Example 3, and Comparative Example 1, respectively. Then, simulation tests were conducted to obtain the corresponding stress distribution map of the quartz wafer body. The results are shown in the table below, specifically in FIG. 8-11. Comparative Example 1, Example 1, Example 2, and Example 3 correspond to FIG. 8, FIG. 9, FIG. 10, and FIG. 11.

TABLE 1

| Results of Simulation Test | | | | |
|---|---|---|---|---|
| | Example 1 | Example 2 | Example 3 | Comparative Example 1 |
| Maximum stress (N/m$^{2}$) | $1.85 \times 10^5$ | $7.03 \times 10^4$ | $7.03 \times 10^3$ | $2.14 \times 10^5$ |

Figure 8:
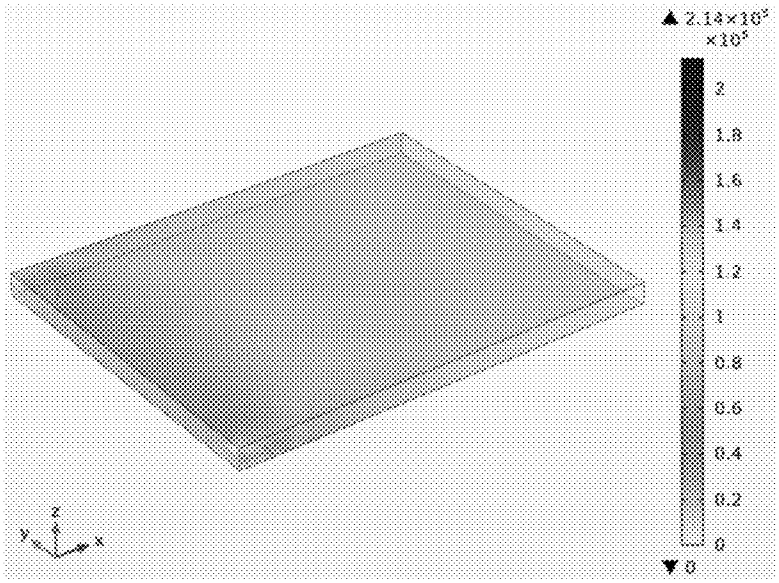
FIG. 8 is a thermal stress simulation diagram of quartz crystal oscillator in Comparative Example 1 in the present application.
Figure 9:
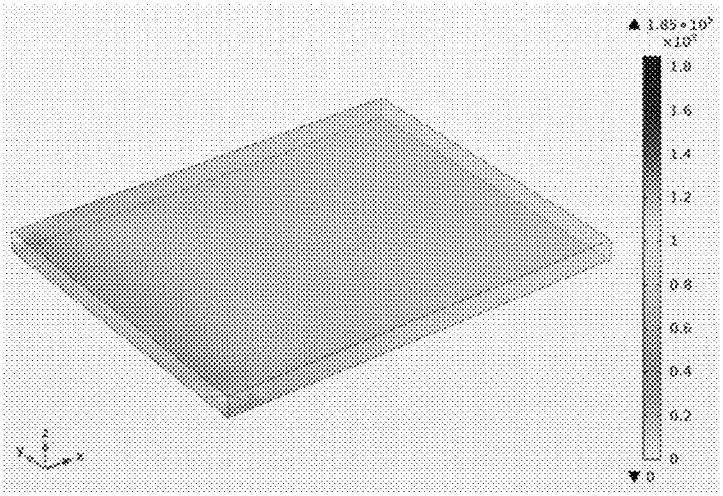
FIG. 9 is a thermal stress simulation diagram of quartz crystal oscillator in Example 1 of the present application.
Figure 10:
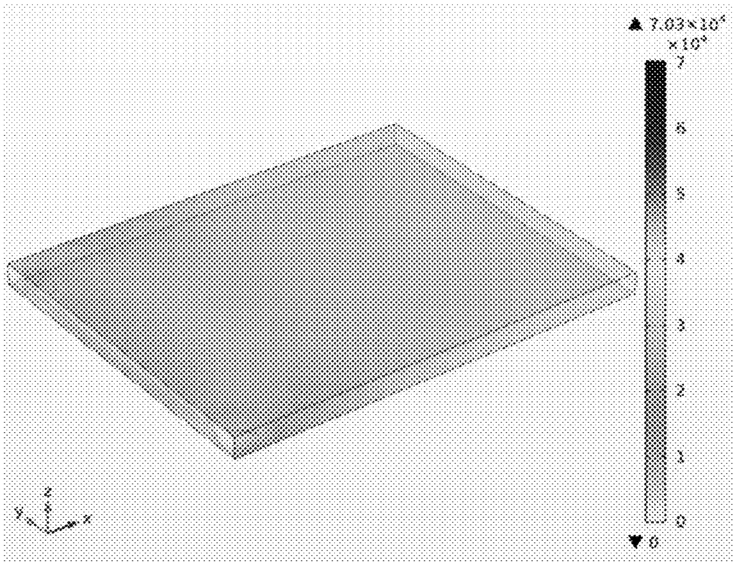
FIG. 10 is a thermal stress simulation diagram of quartz crystal oscillator in Example 2 of the present application.
Figure 11:
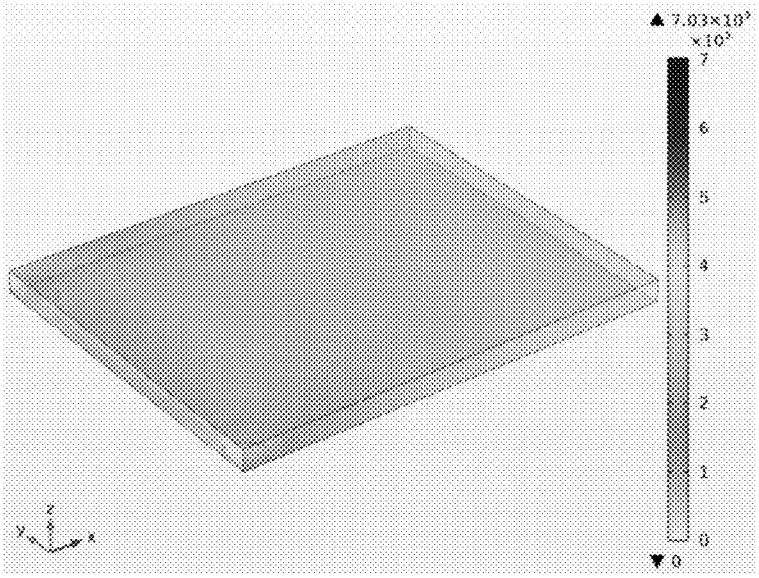
FIG. 11 is a thermal stress simulation diagram of quartz crystal oscillator in Example 3 of the present application.

According to the above table and FIG. 8-10, compared to Comparative Example 1, Examples 1 and 2 demonstrate a decrease in the maximum stress, that is, increasing spacer quartz wafer can effectively reduce the influence of thermal stress on the excitation quartz crystal vibration zone, and improve the output frequency stability of quartz crystal oscillator; in further, Example 2 shows better improvement effect than Example 1, mainly because of the better support stability of the spacer quartz wafer.

In further, compared to Example 2, Example 3 shows adjustment to the rotation angle of spacer quartz wafer, effectively reducing the sensitivity of stress transmission and improving the output frequency stability of quartz crystal oscillator.

The examples of the specific embodiment are the preferred examples of the present application and do not limit the scope of protection hereof. The same components are represented by the same reference numerals. Therefore, any equivalent changes made based on the structure, shape, and principle of the present application shall be covered within the scope of protection hereof.

What is claimed is:

1. A quartz crystal oscillator comprises:

an encapsulation structure having an encapsulation cavity in which a pair of first electrodes is provided;

a spacer quartz wafer inside the encapsulation cavity that is electrically bonded to the encapsulation structure at the pair of first electrodes;

an excitation quartz chip, comprising a quartz wafer body and a pair of excitation electrodes on opposite sides of the quartz wafer body, and a plurality of lead-out ends of the pair of excitation electrodes are spaced apart from each other on the opposite sides of the quartz wafer body and the spacer quartz wafer, and the spacer quartz wafer and the quartz wafer body are electrically bonded at the plurality of lead-out ends of the pair of excitation electrodes, respectively, so that the pair of excitation electrodes are electrically connected to the pair of first electrodes, respectively;

wherein, along a length direction of the quartz wafer body, a ratio of a length of the spacer quartz wafer to a length of the quartz wafer body is less than 0.5.

2. The quartz crystal oscillator of claim 1, wherein a distance between the spacer quartz wafer and the quartz wafer body is 30-50 μm.

3. The quartz crystal oscillator of claim 1, wherein the spacer quartz wafer has a pair of second electrodes spaced apart along a width direction of the quartz wafer body, and each second electrode comprises:

an upper connection portion that is located on one side of the spacer quartz wafer and is opposite to and electrically bonded to one of the plurality of lead-out ends of the pair of excitation electrodes;

a lower connection portion that is located on the other side of the spacer quartz wafer, and is opposite to and electrically bonded to one of the pair of first electrodes; and a transition portion that is connected to the upper connection portion and the lower connection portion, respectively.

4. The quartz crystal oscillator of claim 1, along the length direction of the quartz wafer body, one electrically bonded end of the spacer quartz wafer protrudes from a projection of the quartz wafer body along a thickness direction of the quartz wafer body.

5. The quartz crystal oscillator of claim 4, along the length direction of the quartz wafer body, an electrical bonding point of the spacer quartz wafer is located on a centerline of the spacer quartz wafer.

6. The quartz crystal oscillator of claim 1, wherein a rotation angle of the spacer quartz wafer around axis X of corresponding crystal axis of the spacer quartz wafer along a length direction of the spacer quartz wafer is 60° or 120°.

7. An electronic device comprising the quartz crystal oscillator of claim 1.

* * * * *